US010782257B2

(12) United States Patent
Kantzas et al.

(10) Patent No.: US 10,782,257 B2
(45) Date of Patent: Sep. 22, 2020

(54) COMPOSITE FID-CPMG PROCESS FOR FAST RELAXING MEDIA DETERMINATION

(71) Applicant: PERM Instruments Inc., Calgary, Alberta (CA)

(72) Inventors: Apostolos Kantzas, Calgary (CA); Serguei I. Krioutchkov, Calgary (CA); Zheng Yin Wang, Calgary (CA)

(73) Assignee: PERM Instruments Inc. (CA)

( * ) Notice: Subject to any disclaimer, the term of this patent is extended or adjusted under 35 U.S.C. 154(b) by 730 days.

(21) Appl. No.: 15/416,621

(22) Filed: Jan. 26, 2017

(65) Prior Publication Data

US 2017/0212063 A1 Jul. 27, 2017

Related U.S. Application Data

(60) Provisional application No. 62/287,243, filed on Jan. 26, 2016.

(51) Int. Cl.
*G01N 24/08* (2006.01)
*G01R 33/44* (2006.01)

(52) U.S. Cl.
CPC ......... *G01N 24/081* (2013.01); *G01R 33/448* (2013.01)

(58) Field of Classification Search
CPC ........ G01N 24/081; G01N 24/08; G01V 3/32; G01R 33/5617; G01R 33/448; G01R 33/50; G01R 33/44; G01R 33/445; G01R 33/5615; G01R 33/4641
See application file for complete search history.

(56) References Cited

U.S. PATENT DOCUMENTS

| | | | |
|---|---|---|---|
| 5,023,551 A * | 6/1991 | Kleinberg | G01N 24/081 324/303 |
| 6,452,389 B1 | 9/2002 | Edwards | |
| 6,714,009 B2 | 3/2004 | Heidler | |
| 6,853,188 B2 | 2/2005 | Feinberg et al. | |
| 6,952,096 B2 | 10/2005 | Freedman | |
| 7,535,228 B2 | 5/2009 | Tiernan et al. | |
| 2005/0275401 A1* | 12/2005 | Blanz | G01V 3/32 324/303 |
| 2007/0080685 A1* | 4/2007 | Bydder | G01R 33/561 324/309 |
| 2012/0049849 A1* | 3/2012 | Balcom | G01R 33/3808 324/322 |
| 2012/0286779 A1* | 11/2012 | Walsh | G01R 33/44 324/309 |
| 2013/0193969 A1* | 8/2013 | Grunewald | G01V 3/14 324/309 |
| 2014/0212901 A1 | 7/2014 | Lowery, Jr. et al. | |
| 2014/0361774 A1 | 12/2014 | Jensen | |
| 2015/0177348 A1 | 6/2015 | Peng et al. | |

(Continued)

*Primary Examiner* — Rishi R Patel
(74) *Attorney, Agent, or Firm* — Forge IP, PLLC (57) ABSTRACT

An apparatus, method and computer program for characterising samples using NMR. The apparatus includes a pulse sequence generator; and a response detector. The apparatus is configured to generate transverse and refocusing pulses and to record the decay response of a sample following a transverse pulse and echo response at least once after at least one refocusing pulse in order to enable determination of at least one relaxation time of the sample. In this way, sample or sample components with short relaxation times may be characterized.

20 Claims, 7 Drawing Sheets

(56) References Cited

U.S. PATENT DOCUMENTS

| | | | |
|---|---|---|---|
| 2016/0011290 A1* | 1/2016 | Iannello | A61B 5/055 600/309 |
| 2016/0139291 A1* | 5/2016 | Saidian | G01N 24/081 324/303 |
| 2016/0260243 A1* | 9/2016 | Cloos | G01R 33/5602 |
| 2016/0320323 A1* | 11/2016 | Saidian | G01N 24/081 |
| 2017/0184755 A1* | 6/2017 | Coman | G01V 3/32 |

* cited by examiner

COMPOSITE FID-CPMG PROCESS FOR FAST RELAXING MEDIA DETERMINATION

FIELD OF THE INVENTION

This application is related to systems and methods for using low field NMR (Nuclear Magnetic Resonance) to detect fast relaxation components, NMR instrument design and implementation. Specifically the application relates to using a combination of Free Induction Decay (FID) and Carr-Purcell-Meiboom-Gill (CPMG) NMR processes in order to determine the relaxation time of the sample.

BACKGROUND OF THE INVENTION

In the oil and gas industry, for example, samples may comprise a variety of components (e.g. heavy oil, light oil, water) in a variety of states (solid, liquid, gas). These components may have widely divergent relaxation times. For example, heavy oils (e.g. bitumen) may have an extremely rapid relaxation time (10-100 microseconds) whereas water components may have a much slower relaxation time (e.g. several hundred milliseconds, which is typical of heavy oil-water-mixtures).

In the past, Carr-Purcell-Meiboom-Gill (CPMG) NMR apparatus have been configured to minimize $T_E$ (time to echo) to try to detect the fast relaxation components. However the minimum $T_E$ achievable is limited by many factors (such as coil dimensions, Q factor of the coil, damping circuit, etc.). Therefore, the typical minimum $T_E$ is around 50-100 microseconds at several MHz frequencies for 1-2 inch diameter coil. It is difficult to detect components, which have a relaxation time $T_2$ less than $T_E$. This is particularly a problem in cases where large samples are tested, because the $T_E$ becomes longer by necessity of coil design. This further hampers investigation of fast relaxing media.

Another option is to perform an FID test for very fast relaxing components and a separate CPMG test for slow relaxing components. However, this requires two separate measurements and the fit for each measurement will be over a shorter time scale leading to a corresponding loss off accuracy.

As a result, there continues to be a need for testing equipment and methodologies, particularly for NMR instruments, that allow fast and slow relaxing components to be detected efficiently (e.g. in a single measurement).

SUMMARY OF THE INVENTION

In accordance with the invention, there is provided an NMR apparatus, the NMR apparatus comprising a NMR pulse sequence generator; and a NMR response detector, wherein the NMR apparatus is configured to:

generate a transverse pulse to be applied to a sample;

generate a series of one or more refocusing pulses to be applied to the sample, wherein the first refocusing pulse is configured to be applied a first time period after the transverse pulse and each subsequent refocusing pulse is configured to be applied a respective subsequent time period after the immediately preceding refocusing pulse;

record the decay response of the sample between the transverse pulse and the first refocusing pulse, and record the echo response at least once after at least one refocusing pulse; and enable determination of at least one relaxation time of the sample based on the recorded decay and recorded echo responses.

The NMR apparatus may be configured to record the decay response multiple times between the transverse pulse and the first refocusing pulse.

The NMR apparatus may be configured to record the decay response for a decay record time between the transverse pulse and the first refocusing pulse, the FID record time being at least 10% of the first time period.

The NMR apparatus may be configured to record the echo response for an echo record time between the successive refocusing pulses, the echo record time being at least 10% of the corresponding subsequent time period.

The NMR apparatus may be configured to record the decay response using different time intervals than the time intervals used to record at least one echo response.

The NMR apparatus may be configured to record the decay response repeatedly with a time interval of between 1 µs and 10 µs.

The subsequent time period between successive refocusing pulses may be the same for each subsequent refocusing pulse.

The subsequent time period between successive refocusing pulses may be double the duration of the first time period between the transverse pulse and the first refocusing pulse.

The echo time, $T_E$, may be greater than 50 µs. The echo time, $T_E$, may be less than 100 µs.

The NMR apparatus may be configured to apply the pulse sequence to a sample volume of one or more of: less than 1 ml; between 1 ml and 100 ml; and between 100 ml and 1000 ml.

The NMR apparatus may be configured to subtract a control response from the sample response to compensate for die-off signal.

The NMR apparatus may be configured to that each subsequent refocusing pulse is inverted with respect to the immediately preceding pulse.

According to a further aspect, there is provided a method of determining the at least one relaxation time of the sample the method comprising:

applying a transverse pulse to a sample;

applying a series of one or more refocusing pulses to the sample, wherein the first refocusing pulse is applied a first time period after the transverse pulse and each subsequent refocusing pulse is applied a respective subsequent time period after the immediately preceding refocusing pulse, recording the decay response of the sample between the transverse pulse and the first refocusing pulse, and record the echo response at least once after at least one refocusing pulse; and enabling determination of at least one relaxation time of the sample based on the recorded decay and recorded echo responses.

The measured relaxation time, $T_2^*$, may be less than the echo time, $T_E$.

The sample may comprise hydrocarbons and water.

The sample may comprise an industrial sample.

The method may comprise applying the first refocusing pulse before the experimental response of the sample has finished decaying. The experimental response may be considered to have finished decaying when it decays to a predetermined proportion of its initial value (e.g. 20%, 10% or 5%); when the experimental response is indistinguishable from the instrument noise level; and/or when it decays to a predetermined absolute value.

The sample decay time constant ($T_2$) may be less than a predetermined proportion of the apparatus decay time constant ($T_{2a}$). For example, the sample decay time constant ($T_2$) may be less than $1/10^{th}$ (or less than $1/5^{th}$; less than $1/20^{th}$;

or less than 1/100$^{th}$) of the apparatus decay time constant ($T_{2a}$). The sample decay time constant used for defining the apparatus decay time constant ($T_{2a}$) may relate to the decay time constant ($T_2$) of the fastest relaxing component; and/or an average decay time constant for the whole sample (e.g. $T_{2gm}$).

The method may comprise:

performing an NMR measurement on a control, the control being an NMR inactive sample or no sample;

recording the response of the control, including at times corresponding to 90° transmitting pulse (or other transverse pulse) and/or 90° pulse (or transverse) die-off signal;

performing the measurement of the sample with the same NMR parameters as the control; and recording the response of the sample, including at times corresponding to 90° transmitting pulse (or other transverse pulse) and/or 90° (or transverse) pulse die-off signal;

subtracting the recorded response of the control from the recorded response of the sample;

enable determination of at least one relaxation time of the sample based on the result of the subtraction.

According to a further aspect, there is provided a computer program comprising computer program code configured, when run on a computer, to:

enable applying a transverse pulse to a sample;

enable applying a series of one or more refocusing pulses to the sample, wherein the first refocusing pulse is applied a first time period after the transverse pulse and each subsequent refocusing pulse is applied a respective subsequent time period after the immediately preceding refocusing pulse, enable recording the decay response of the sample between the transverse pulse and the first refocusing pulse, and record the echo response at least once after at least one refocusing pulse; and enable determination of at least one relaxation time of the sample based on the recorded decay and recorded echo responses.

A computer program may be stored in a non-transitory medium such as a CD or hard-disk.

Further Explanation of Terms $T_2$ is the spin-spin or transverse relaxation time. $T_2$ may be dependent on a number of parameters including: temperature; mobility of the observed spin (microviscocity); and/or presence of large molecules, paramagnetic ions and molecules, or other outside interference.

In addition to rotation, the net magnetization starts to dephase because each of the spin packets making it up is experiencing a slightly different magnetic field and rotates at its own Larmor frequency. The longer the elapsed time, the greater the phase difference. Here the net magnetization vector is initially along the y-axis. For this and all dephasing examples this vector may be thought of as the overlap of several thinner vectors from the individual spin packets.

The time constant which describes the return to equilibrium of the transverse magnetization, $M_{XY}$, is called the spin-spin relaxation time, $T_2$. The transverse magnetization, $M_{XY}$ varies with time, t, follows:

$$M_{XY}=M_{XY0}e^{-t/T_2},$$

where $M_{XY0}$ is the initial transverse magnetization. The net magnetization in the x-y plane goes to zero and then the longitudinal magnetization grows in until the magnetic field aligns with the z direction. Any transverse magnetization may behave the same way. The transverse component rotates about the direction of applied magnetization and dephases.

$T_2$* is the characteristic experimental relaxation decay time of transverse magnetization caused by a combination of spin-spin relaxation ($T_2$) and device parameters (e.g. magnetic field inhomogeneity). Magnetic field inhomogeneity may include static field non-uniformity (e.g. due to imperfections in the construction of the permanent magnet itself as well as from magnetic susceptibility effects in the sample). The combination of these two factors is what actually results in the experimental decay of transverse magnetization (which may also be an exponential decay). The relationship between the $T_2$ from molecular processes and that from apparatus in the magnetic field is as follows:

$$1/T_2^*=1/T_2+1/T_{2a},$$

where $T_{2a}$ is the characteristic instrument decay time. The sample decay rate constant may be considered to be $1/T_2$ and the apparatus decay rate constant may be considered to be $1/T_{2a}$. Therefore, analogous to the sample decay equation above, the experimental decay response, $M_{XY}$* may be of the form:

$$M_{XY}^*=M_{XY0}^*e^{-t/T^*_2}$$

$T_E$ is the echo time. The echo Time ($T_E$) may be considered to be the time between the transverse pulse and the maximum of echo response. In some cases, the echo time may be considered to be the time between two successive echoes. Generally, the first refocusing pulse is applied at time $t=T_E/2$ after the transverse pulse. $T_E$ is a parameter that can be adjusted by the instrument operator based on the specific testing samples.

$T_{2gm}$ is the geometric mean relaxation time or the weighted average of $T_2$ and is the mean of the $T_2$ distribution. The mean is a logarithmic average, since the $T_2$ values in an NMR spectrum are plotted on a logarithmic scale. That is, $T_{2gm}$ is the geometric mean relaxation time. This mean is calculated by weighted averaging of $T_2$ logarithms and by exponentiation of the result. Since the $T_2$ values in an NMR spectrum are distributed over several orders of magnitude this mean may be more suitable for spectrum characterization than, for example, weighted arithmetic mean.

For a single exponentially decaying fluid such as water, the relaxation time of the fluid can be expressed as essentially a single value of $T_2$. For more complex systems such as oil or water in multiple pore sizes, the fluid relaxation time is better described by this mean value. In this manner, $T_{2gm}$ may be used to characterize the overall property of $T_2$ and is calculated using the equation:

$$T_{2gm} = \exp\left[\frac{\sum_i A_i \ln(T_{2i})}{\sum_i A_i}\right],$$

where $A_i$ is the amplitude value corresponding to a specific relaxation time $T_{2i}$.

In magnetic resonance, a refocusing pulse is a pulse of electromagnetic radiation which causes a refocusing of spin magnetisation (and so causes a spin echo). A refocusing pulse may be a 180° pulse.

BRIEF DESCRIPTION OF THE DRAWINGS

Various objects, features and advantages of the invention will be apparent from the following description of particular embodiments of the invention, as illustrated in the accompanying drawings. The drawings are not necessarily to scale, emphasis instead being placed upon illustrating the principles of various embodiments of the invention. Similar reference numerals indicate similar components.

FIG. 3b is a graph of fitting parameters used to fit the fitted relaxation curve of FIG. 3a.

DETAILED DESCRIPTION OF THE INVENTION

Introduction

With reference to the figures, NMR measurements are described. These measurements may be low field NMR measurements. Low field NMR measurements may relate to frequencies of proton magnetic resonance of a few MHz or lower (e.g. less than or equal to 5 MHz). The invention relates to apparatus, method and computer program for characterising samples using NMR. The apparatus comprises a pulse sequence generator; and a response detector. The apparatus is configured to generate transverse and refocusing pulses and to record the decay response of a sample following a transverse pulse and echo response at least once after at least one refocusing pulse in order to enable determination of at least one relaxation time of the sample. In this way, sample or sample components with short relaxation times may be characterized. That is, the described systems are particularly applicable for conducting NMR measurements on samples comprising fast-relaxing and slow-relaxing components.

The subject invention seeks to characterise samples comprising fast-relaxing and slow-relaxing components efficiently. More specifically, the subject invention may provide a measurement sequence which allows one or more fast-relaxing components to be detected.

Advantages of using both the decay response and the echo response in combination to characterise at least one relaxation time of the sample may include that the fit of the relaxation is better as it can be fitted over a longer time scale (e.g. spanning from the short time-scales of the decay response to the longer time-scales of the one or more echo responses). In addition, for samples where the relaxation time is difficult to estimate beforehand, the present technology may allow a more comprehensive characterisation of the relaxation time in a single run. That is, if it was not known whether a sample contained fast-relaxation components, it may not be necessary to run a FID NMR determination to find out.

Furthermore, by characterising fast and slow-relaxing components at the same time, the same characterising procedure may be applied to a wide range of samples allowing for better comparisons between the samples (e.g. using a standard procedure). For example, if one sample contained only water components, a CPMG measurement may be used. However, if a second sample for comparison (e.g. from the same well) contained water and bitumen, a supplementary FID test may need to be performed to characterise the bitumen components. In the present invention, the comparison between the two samples may be more rigorous as both samples could be characterised using the same procedure.

In addition, by using the decay response between the transverse pulse and the first refocusing pulse, the echo time of the NMR apparatus may be longer. This may allow larger NMR coils to be used (e.g. allowing for larger samples to be characterised).

All terms used within this specification have definitions that are reasonably inferable from the drawings and description. In addition, the language used herein is to be interpreted to give as broad a meaning as is reasonable having consideration to the rationale of the subject invention as understood by one skilled in the art. It is also to be understood that prior art cited during prosecution of the subject patent application may not have been specifically identified prior to the drafting of the subject document and that various amendments may be introduced during prosecution that require amendment of terms to provide clarity to the distinctions between the subject invention and that prior art and that such amendments are reasonably inferable having consideration to the document as a whole and the rationale of the invention.

Various aspects of the invention will now be described with reference to the figures. For the purposes of illustration, components depicted in the figures are not necessarily drawn to scale. Instead, emphasis is placed on highlighting the various contributions of the components to the functionality of various aspects of the invention. A number of possible alternative features are introduced during the course of this description. It is to be understood that, according to the knowledge and judgment of persons skilled in the art, such alternative features may be substituted in various combinations to arrive at different embodiments of the present invention.

Conventional NMR Measurements—Prior Art

Figure 1:
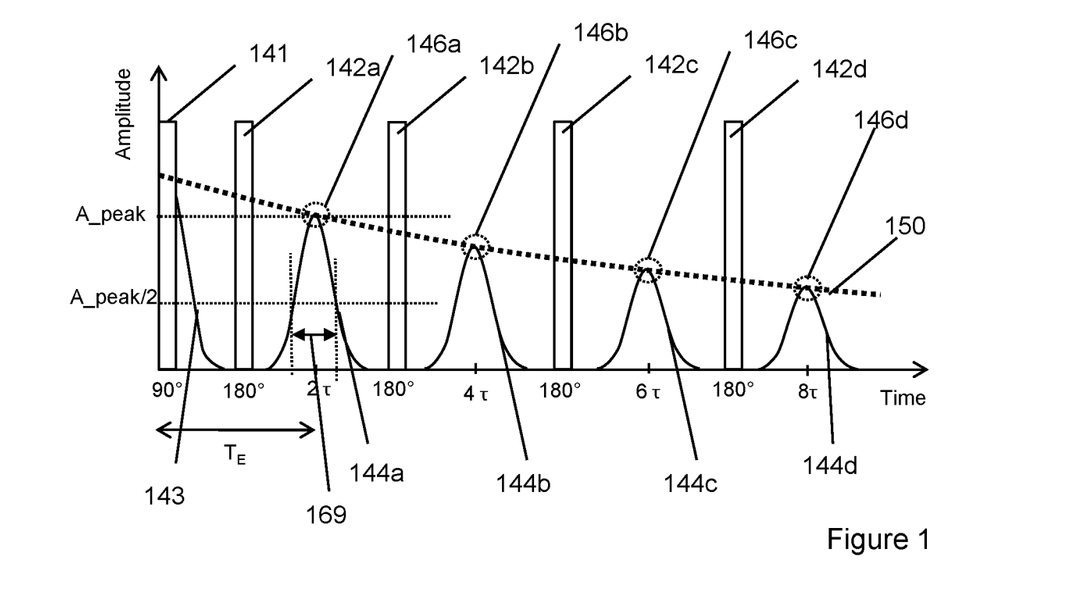
FIG. 1 is an NMR response and fit determined by a conventional CPMG technique (prior art).

FIG. 1 depicts the pulse sequence 141, 142a-d and detected response 143, 144a-d in a typical CPMG experiment. Before the first pulse 141 has been applied, the magnetic moment in the z direction. Then at time t=0, a magnetic field B is applied giving a transverse (e.g. 90°) pulse 141 which rotates the magnetic moment into the x-y plane. After the magnetic moment is in the x-y plane, the magnetic moments will then dephase 143. Then after a time period, r, a refocusing (e.g. 180°) pulse is applied causing the spins to rephase yielding an echo response 144a. In this case, subsequent 180° pulses are applied, each 180° pulse being applied after a subsequent time period, $T_E$. Each subsequent 180° pulse results in a further echo response 144b-144d. In this case, the echo response time $T_E = 2\tau$.

In this case, the experimental relaxation time $T_2^*$ is less than the echo time, $T_E$. This means that, the experimental response (due to the sample and the apparatus) has decayed by the time the first refocusing response is applied to the sample.

In this case, the relaxing curve 150 is fitted to the peaks of the CPMG echoes only. That is, only the points within dotted circles 146a-146d for each echo are used to fit the relaxing curve.

If the $T_{2gm}$ value ($T_{2gm}$ defines a characteristic timescale over which the relaxing curve exponentially decreases) is bigger than $T_E$ (that is, if the relaxing curve is substantially the same over a time interval $T_E$), the traditional method (just using CPMG echoes) may be sufficient to rebuild the relaxing curve. However, if the sample contains components with a fast relaxation constant, $T_2$, then this traditional method may not be sufficient to accurately characterise the sample.

Furthermore, in the prior art, e.g. separated traditional FID method and traditional CPMG method, in which $T_2^*$ is less than $T_2$ due to non-perfection homogeneity of the magnetic field.

The shape of FID signal and the shape of CPMG echoes are mainly determined by two factors: the sample relaxation components and homogeneity quality of the magnetic field. Better homogeneity quality for the volume of sample size is preferable for better instrument performance.

For each CPMG echo, echo width can be used to reflect the homogeneity quality of the magnetic field. The definition of echo width can be defined as the time interval between the points, which produce half of the peak amplitude (e.g. full width half maximum—FWHM). FIG. 1 demonstrates the echo width 169 for the first CPMG echo 144a.

The echo width may be proportional to the homogeneity quality of magnetic field; this means better homogeneity quality will produce wider echo width for the same sample.

Considering $1/T_2^* = 1/T_2 + 1/T_{2a}$, for traditional FID method, when $1/T_{2a} \ll 1/T_2$ then $1/T_2^* \approx 1/T_2$. If $T_2$ of the sample is bigger than 10 ms or even higher, it is generally not practical to fulfill the condition of $1/T_{2a} \ll 1/T_2$ due to limited homogeneity quality of the magnetic field. This means that, due to the limited homogeneity quality of the magnetic field, traditional FID method can be used only when $T_2$ is relatively small, less than 10 ms.

Traditional CPMG method was invented so $1/T_2^* \approx 1/T_2$ without the condition of $1/T_{2a} \ll 1/T_2$.

If $T_2$ is relatively small, less than 10 ms or even 0.1 ms, this prior art traditional CPMG method becomes very challenging because of limited time to echo, $T_E$. Minimizing time to echo $T_E$ becomes a trend for most instrument designers but time to echo $T_E$ can only be minimized up to a certain level due to the instrument dead time, 0.1 ms or even bigger. The dead time is one of the programmable parameters of the instrument, and may be considered to be the time period between end of the transmitting pulse and start of the acquiring the NMR signal.

In the prior art, traditional FID method can only be used if $T_2$ is less than 10 ms or even smaller, whereas traditional CPMG method can be used if $T_2$ is bigger than $T_E$ (e.g. 0.1 ms or even bigger). In other words: CPMG on its own could not cover short $T_2 < 0.1$ ms, and FID on its own could not cover $T_2 > 10$ ms. When used together according to the present disclosure they can cover both short and long relaxation times. Typical high values of $T_2$ reach several seconds (even tens of seconds), while short $T_2$ can easily be tens of microseconds; both ends of this spectrum may be present in the same sample.

Figure 3A:
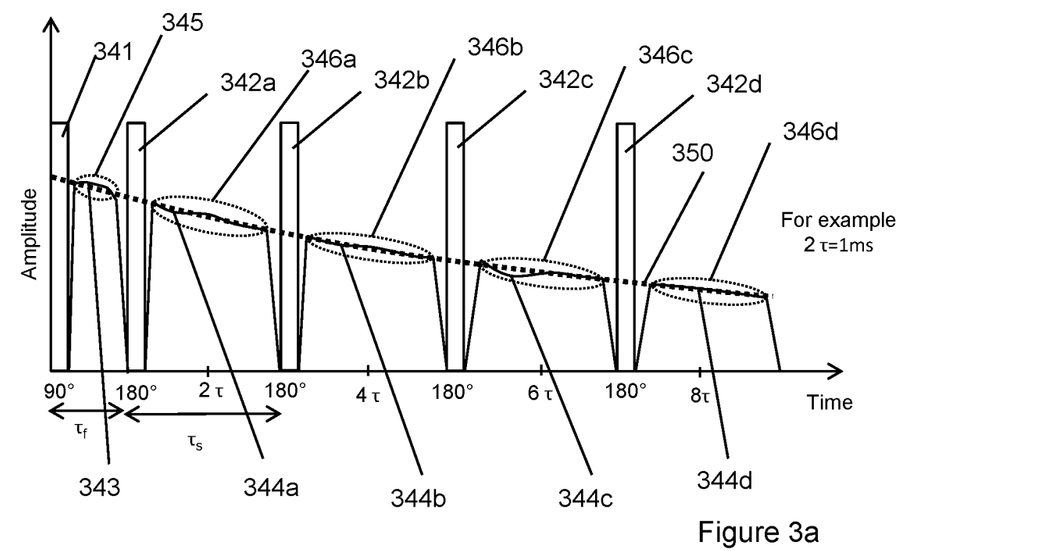
FIG. 3a is a graph of an NMR response and fitted relaxation curve determined by a technique according to the present disclosure.
Figure 3B:
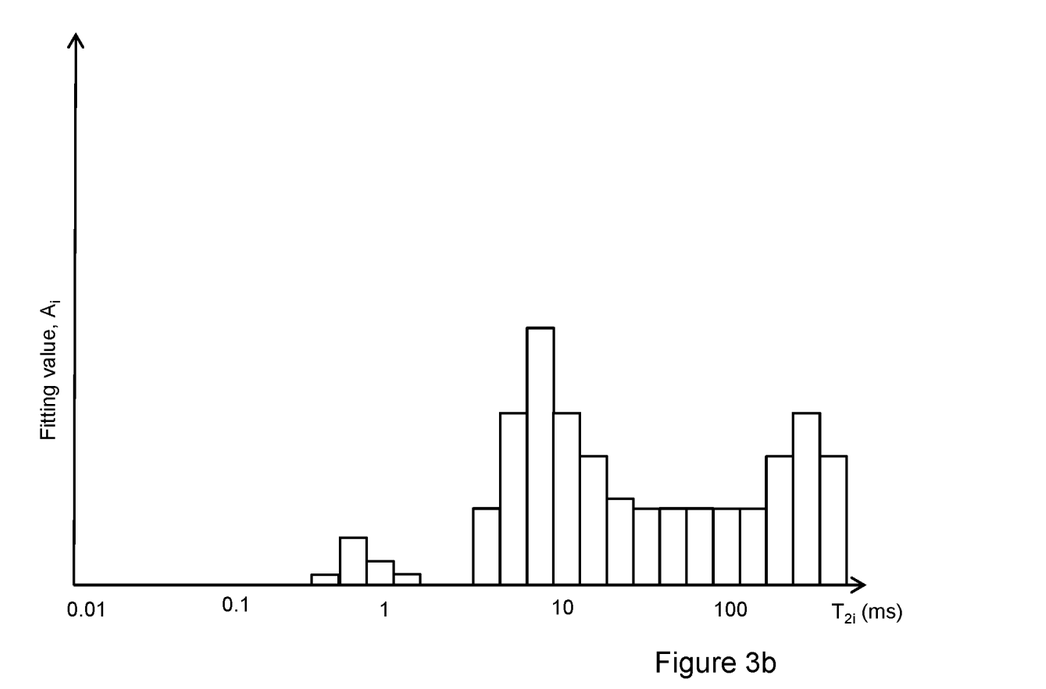
Figure 5:
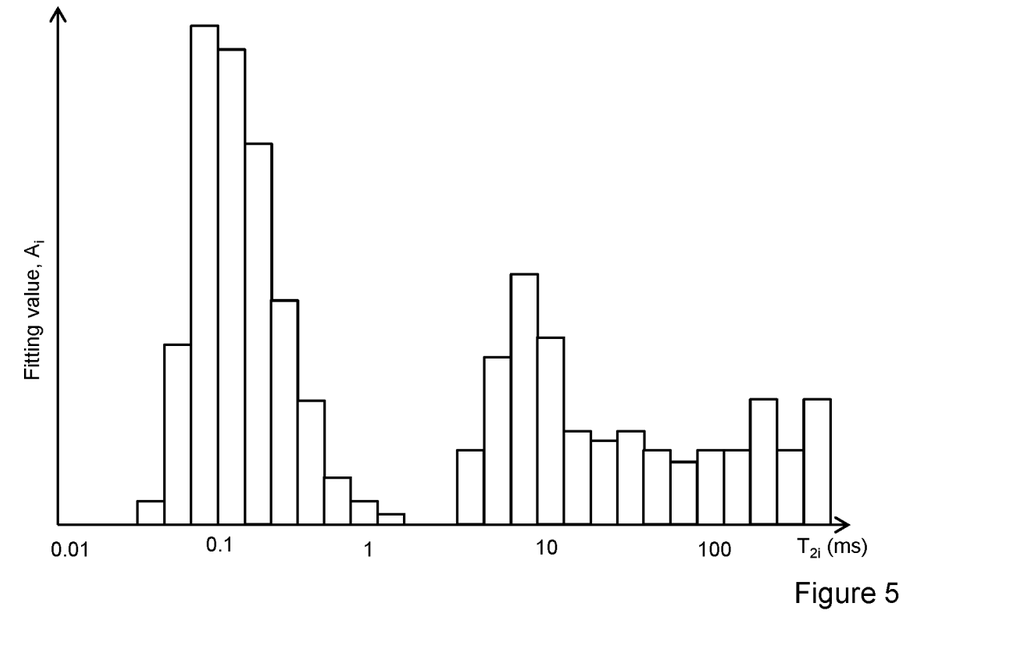
FIG. 5 is a graph of fitting parameters used to fit the fitted relaxation curve of FIG. 4.

Unfortunately for the real testing samples, it is unknown for the $T_2$ values of the samples, and for most scenarios the sample may contain both fast and slow relaxing components at the same time or even more complicated $T_2$ spectrum distribution shown in FIG. 3b and FIG. 5.

This invention combined FID-CPMG method can be used to measure any unknown samples to detect fast and slow relaxing components or any components mixtures shown in the $T_2$ spectrum at the same time for one measurement if the component exists in the testing sample.

NMR Apparatus

Figure 2:
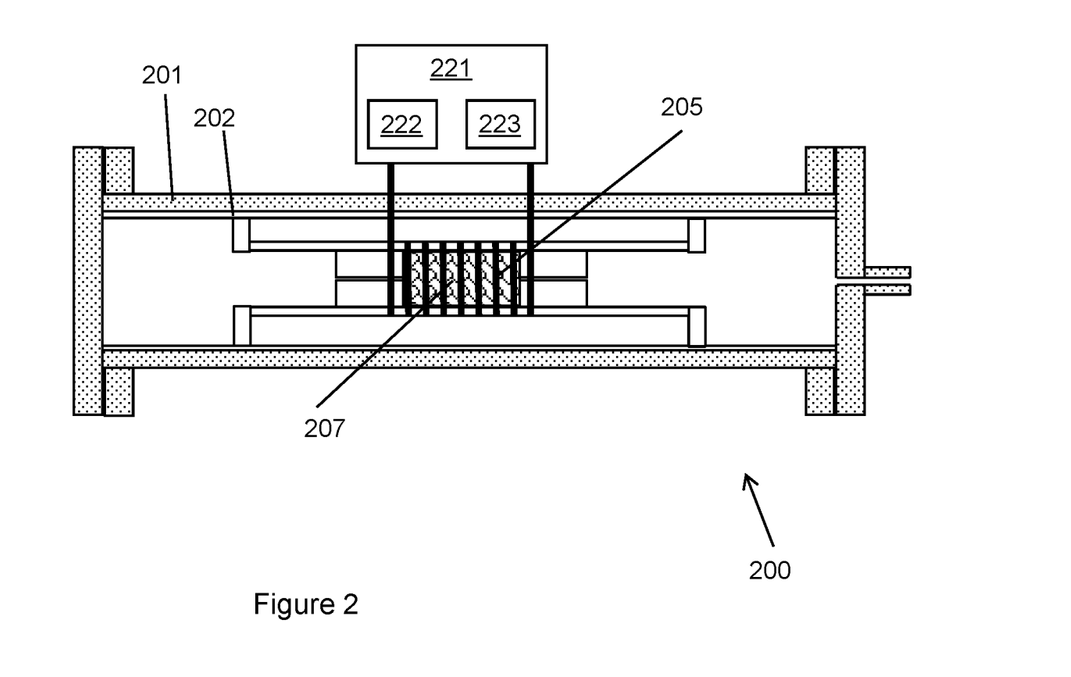
FIG. 2 is a schematic cross-sectional diagram of the general design concepts of an NMR apparatus according to the present disclosure.

FIG. 2 depicts a cross-section of an NMR apparatus 200 comprising: a NMR pulse sequence generator 222; and a detector 223. The sequence generator and the detector in this case form part of a control system 221. In this case the NMR apparatus also comprises a chamber 201 which holds an NMR coil 205 within which a sample 207 is placed. It will be appreciated that other embodiments may be configured to allow NMR measurements to be made on flowing fluids (e.g. flowing through a pipe). It will be appreciated that other embodiments may be configured to allow NMR measurements on a sample contained within a chamber which is inside an NMR coil.

The control system 221 may comprise a processor, and at least one memory (which may store computer program code). A processor may comprise one or more of: a central processing unit and a microprocessor (e.g. an application-specific integrated circuit (ASIC), an application-specific instruction set processor (ASIP), a graphics processing unit (GPU), a digital signal processor (DSP)). Memory may comprise volatile (e.g. RAM) and/or non-volatile memory (e.g. hard drive, flash memory, CD, DVD or other disc). The control system may be configured to instruct the signal generator to generate a sequence of pulses to be applied to the sample. The control system may be configured to record the responses of the sample and/or to determine at least one relaxation time of the sample based on the recorded responses.

Chamber

In this case, the chamber 201 is a confined pressure chamber comprising a pipe section which is sealed at each end by two end-pieces. In this case, the pressure chamber 201 comprises metallic titanium and/or titanium alloy. It will be appreciated that other materials may be used. The end-pieces are attached to each end of the pipe by means of connecting flanges (such as a standard pipe flange having bolt holes and threaded connector). It will be appreciated there may be a gasket between the end-pieces and the flanges to improve the seal. It will be appreciated that the end-pieces may be connected and/or sealed by other appropriate connectors (e.g. the pipe and end-pieces may have corresponding screw threads). It will be appreciated that, in other embodiments, the confined chamber may comprise a vessel with a lid; or two concave portions which when connected form the confined pressure chamber. In any case, the confined pressure chamber may be considered substantially sealed.

In this case, the pressure chamber 204 is cylinder-shaped, and the NMR coil 205 axis is aligned with the axis of the pressure chamber. By using a pressure chamber 201 with a symmetry which corresponds to the NMR coil 205, the NMR field applied to the sample may be more consistent throughout the sample's bulk.

In this case, the pressure chamber 201 also comprises a conductive inner layer 202, the conductive inner layer 202 configured to constrain the magnetic field of the NMR coil and/or to shield the interior of the pressure chamber from external magnetic fields. The material of conductive inner layer 202 may have a conductivity the same as or greater than the material of the NMR coil 205. In this case, both the NMR coil 205 and the conductive inner layer 202 comprise metallic copper. The conductive inner layer 202 may comprise the same non-magnetic material as the coil 205. The coil material is typically copper as described below. The purpose of conductive inner layer 202 is to provide magnetic-noise shielding from outside the pipe and maximizing the Q factor of the coil.

Q-factor, or quality factor, of the resonant circuitry that includes the coil 205 and serves as a sensor of the NMR response is defined by the standard relation:

$$Q = 2\pi \frac{\text{Energy stored}}{\text{Energy dissipated per cycle}}$$

Depending on the conditions of operations it can be advantageous to have a lower value of the Q-factor. In this case the system can be used without conductive inner layer 202.

Lower Q-factor (5 to 10) is needed in order to reduce or minimize $T_E$, which is very important for measuring heavy bitumen fast relaxation components.

Higher Q-factor (above 20) may be particularly advantageous when filling factor is below 0.1 or when water and oil percentage in the sample is less than 10% to get a reasonable high SNR (e.g. a signal to noise ratio of above 50). In other embodiments, if there is enough water or oil in the samples, the Q-factor may be lower (e.g. below 20 but above 5) in order to simplify the design (for example by omitting conductive inner layer).

In a preferred embodiment, conductive inner layer 202 is a copper design on at least a portion of the inner surface of the pressure chamber 201. Generally, the conductive inner layer will improve the Q factor of the coil when the gap between conductive inner layer 202 and the coil 205 is limited. However, as noted above, the conductive inner layer 202 is not necessarily required.

NMR Coil

In order to make the useable measuring area (sweet spot) long enough the NMR coil 205 length (shown in FIG. 2) may be at least two times the outer diameter of the NMR coil 205. In addition, the conductive inner layer 202 length may be at least four times the outer diameter of the NMR coil 205. These factors may make the measureable length at least as long as the outer diameter of the NMR coil 205.

In this case, the NMR apparatus comprises an NMR system configured to apply a sequence of one or more CPMG (Car-Purcell-Meiboom-Gill) pulses and an FID (Free induction decay) pulse to the NMR coil. It will be appreciated that the NMR coil 205 may form part of the NMR apparatus.

It will be appreciated that the NMR apparatus may comprise a control system (not shown), the control system configured to control one or more of the following: pulse sequence applied to the NMR coil 205; temperature applied to the sample 207; pressure applied to the sample 207; and flow rate of fluid through the sample 205.

The NMR apparatus may be configured to enable NMR measurements of the sample 207 to be made at different pressures.

The NMR apparatus may be configured to enable NMR measurements of the sample 207 to be made as the pressure applied to the sample 207 changes.

The NMR control system may be configured to distinguish the state of various materials based on the relaxation time. For example, a gas in open space may relax slowly (typically, on the scale of seconds), while an adsorbed gas may relax extremely quickly (in milliseconds or even microseconds range).

The NMR apparatus may be configured to detect $^1H$ and/or $^{13}C$, although other nuclei from isotopes of many other elements may be used as well.

Sample

In this case, the sample 207 comprises a core sample obtained from the earth using a core drill. The sample may comprise a core sample from a tight formation. A tight formation may have a porosity of less than 10% and/or a permeability of less than 1 mD (0.001 (μm)$^2$)) It will be appreciated that other porous samples may be used (e.g. from the food and/or chemical industry). In this case, the length of sample 207 can be the same or shorter than sweet spot length (the sweet spot length may be around 20 cm) in the direction of the NMR coil axis. It will be appreciated that the length of sample 207 may be longer than sweet spot length. In other embodiments, the length of the sample in the direction of the NMR coil axis may be shorter or longer than coil length (e.g. between 1 cm and 10 cm).

In other embodiments, the sample may be a fluid sample (e.g. comprising gas and/or liquid). For example, a fluid sample may comprise an emulsion of oil and water.

Composite FID—CPMG Measurements

Example 1

FIG. 3a depicts the pulse sequence 341, 342a-d and detected response 343, 344a-d in a composite FID-CPMG determination (e.g. performed by the apparatus depicted in FIG. 2). Before the first pulse 341 has been applied, the magnetic moment in the z direction. Then at time t=0, a magnetic field B is applied giving a 90° transverse pulse 341 which rotates the magnetic moment into the x-y plane. After the magnetic moment is in the x-y plane, the magnetic moments will then dephase. In this case, the NMR apparatus is configured in order that the dephasing due to the device is such that the decay response $T_2^*$ is dominated by the sample rather than the NMR apparatus itself (as was the case in the prior art example of FIG. 1). That is, $T_2^* \approx T_2$.

Then after a first time period, τ, a refocusing 180° pulse 342a is applied causing the spins (which have at least partially dephased during the first time period following the initial transverse pulse) to rephase yielding an echo response 344a. In this case, subsequent 180° pulses are applied, each 180° pulse being applied after a subsequent time period, $T_E$, which in this case is double the first time period, i.e. 2 τ. Each subsequent refocusing pulse results in a further echo response 344b-d. In this case, the echo response time $T_E$=2τ. That is, in this case, the subsequent time period is the same for each subsequent refocusing pulse 342b-d. In some embodiments, the subsequent time period may be different for different subsequent refocusing pulses.

In this case, the apparatus is configured to have a better magnetic filed homogeneity compared to the experiment discussed in relation to FIG. 1. That is, in this case, unlike the prior art example the experimental relaxation time $T_2^*$ is greater than the echo time, $T_E$. This means that the FID response and the echo response are much broader. This means that the one or more of the refocusing pulses are applied before the magnetic field response has relaxed.

In this way, the relaxing curve (e.g. a single relaxing curve) may be fitted to the decay response 343 following the initial transverse pulse 341 as well as the echo responses 344a-d following the refocusing pulses 342a-d.

Therefore, in this case, the relaxing curve is fitted to the FID and CPMG echo response amplitudes. In this case, the NMR apparatus is configured record the Free Induction Decay (FID) response for a FID record time between the transverse pulse and the first refocusing pulse. It will be appreciated that the broader the FID response, the longer the FID record time may be.

It will be appreciated that, in other embodiments, the NMR apparatus may be configured to sample the decay response multiple times. That is, rather than simply taking the peak of the response to determine the relaxation curve, multiple recorded points may be taken into account. It will be appreciated that multiple points of subsequent echo responses may also be recorded. Because, for an exponential decaying function, the rate of change of the function decreases with time, having more recorded points at the start may allow a better fit of the relaxation curve to be determined.

Similarly, the NMR apparatus may be configured to record the decay response using different time intervals (e.g. at a different frequency) than the time intervals used to record at least one echo response. For example, the NMR apparatus may be configured to record the decay response at a higher frequency than the frequency used to record the at least one echo response.

In this case, the points within dotted ellipses 345, 346a-d for the decay response 343 and each echo response 344a-d are used to fit the relaxing curve 350. In this case, the relaxing curve 350 is fitted by a sum of exponentials:

$$f(t)=\Sigma_i A_i \exp(-t/T_{2i}),$$

where $A_i$ is the fitting parameter for the corresponding relaxation time, $T_{2i}$. Multiple algorithms may be used for this fitting procedure. For example, a NNLS (non-negative least squares) algorithm may be used to determine the fitting parameters. It will be appreciated that each fitting parameter, $A_i$, may be constrained to be a positive real number. It will be appreciated that the relaxation times, $T_{2i}$, which are fitted may range from very short (30 μs) to very long ones (tens of seconds).

The fit corresponding to the relaxing curve shown in FIG. 3a is shown in FIG. 3b.

From this fitting data, an average of the relaxation times, $T_{2gm}$, may be calculated using the equation:

$$T_{2gm} = \exp\left[\frac{\sum_i A_i \ln(T_{2i})}{\sum_i A_i}\right],$$

where $T_{2i}$ is the relaxation constant and $A_i$ is the corresponding amplitude. $T_{2gm}$ values may be determined for the full spectrum and/or components of the sample (e.g. the water component; hydrocarbon component; bitumen component and/or solvent component).

It will be appreciated that different peaks in the fit (e.g. FIG. 3b) may correspond to different materials. For example, the peak centered at about 0.1 ms may correspond to oil. The shape of the peak may allow information on the material within the sample to be determined. For example, portions of the oil peak may correspond to bulk liquid oil, whereas different portions of the peak may correspond to absorbed oil. Similarly, different portions of a peak may correspond to different compounds within a class of compounds within a mixture. For example, a peak may correspond to hydrocarbons and the peak shape may give an indication of the relative quantities of different hydrocarbons (e.g. bitumen, heavy oil, light oil, aromatic or aliphatic hydrocarbons) within the hydrocarbon class. Components with longer relaxation constants may correspond to water. In this way, both fast and slow relaxing components may be detected at the same time.

Relaxation values may be used to characterise the condition of the material. For example, the relaxation value of a material may change if it is in bulk, or absorbed or in small pores. As another example, clay bound water may have a characteristic response. In this way, the clay content may be determined based on the $T_{2gm}$ values of the water.

Relaxation values may be used to characterise the nature of the material. For example, oil relaxation values may decrease with increasing oil viscosity.

Example 2

Figure 4:
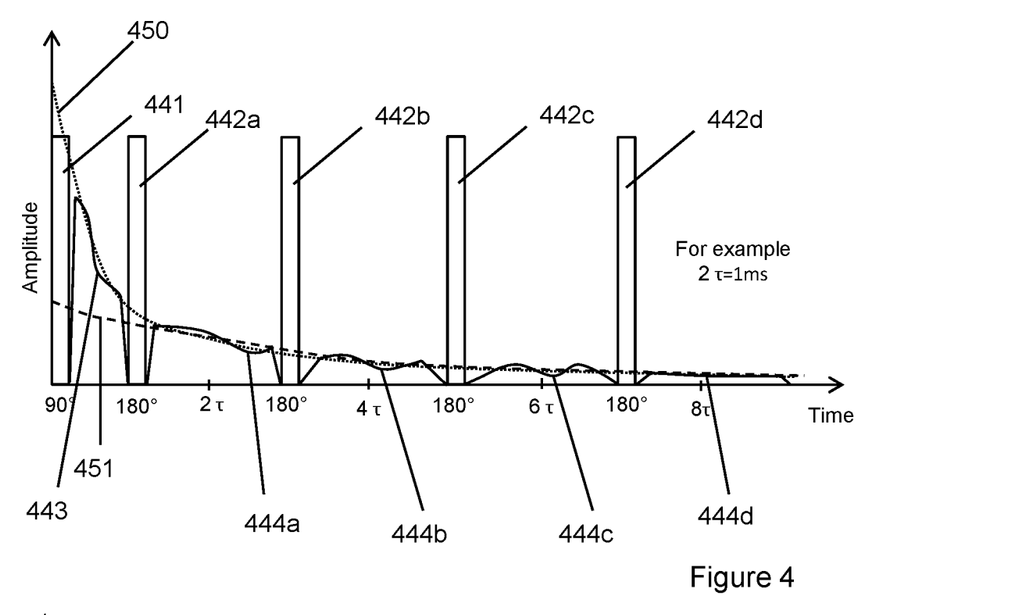
FIG. 4 is a graph of an NMR response and fitted relaxation curve determined by a technique according the present disclosure.

FIG. 4 depicts the pulse sequence and detected response in a composite FID-CPMG experiment. Before the first pulse 441 has been applied, the magnetic moment in the z direction. Then at time t=0, a magnetic field B is applied giving a transverse pulse 442a (e.g. 90° pulse) which rotates the magnetic moment into the x-y plane. After the magnetic moment is in the x-y plane, the magnetic moments will then dephase resulting in a decay response 443. Then after a first time period, τ, a refocusing pulse 442a (e.g. a 180° pulse) is applied causing the spins to rephase yielding an echo response 444a. In this case, subsequent 180° pulses 442b-d are applied, each refocusing pulse 442b-d being applied after a subsequent time period, $T_E=2\tau$. Each subsequent refocusing pulse 442b-d results in a further echo response 444a-d. In this case, the echo response time $T_E=2\tau$ In this case, the relaxing curve is fitted to the FID and CPMG echo response amplitudes. In this case, the NMR apparatus is configured to record the Free Induction Decay (FID) response for a FID record time between the transverse pulse and the first refocusing pulse. It will be appreciated that the broader the FID response, the longer the FID record time can be. The FID record time may, for example, be at least 10% of the first time period between the transverse pulse and the first refocusing pulse. Unlike the previous case, the relaxation curve is only fitted to one point on each echo response (e.g. the response value at the mid-point between successive refocusing pulses). In this way, the data processing may be performed more quickly. In other embodiments different sampling may be used for the fit. For example, one embodiment may decrease the sampling frequency with time (e.g. exponential decay).

In this case, the points within dotted ellipses 345, 346a-d for the decay response 343 and each echo response 344a-d are used to fit the relaxing curve 350. In this case, the relaxing curve 350 is fitted by a sum of exponentials:

$$f(t)=\Sigma_i A_i \exp(-t/T_{2i}),$$

where $A_i$ is the fitting parameter for the corresponding relaxation time, $T_{2i}$. Multiple algorithms may be used for this fitting procedure. For example, a NNLS (non-negative least squares) algorithm may be used to determine the fitting parameters. It will be appreciated that each fitting parameter, $A_i$, may be constrained to be a positive real number. It will be appreciated that the relaxation times, $T_{2i}$, which are fitted may range from very short (30 μs) to very long ones (tens of seconds).

In this case, the sample comprises a significant proportion of components (e.g. bitumen) with fast relaxation times (e.g. with $T_2<T_E$). As indicated in FIG. 5, these components would not be accurately detected using a conventional CPMG experiment because these components would already have significantly relaxed before the first refocusing pulse 442a is applied. Therefore, a fit of only the echo responses were used (as in a conventional CPMG experiment) to characterise the relaxing curve 451, the fast relaxing components may not be detected or detected less accurately (as indicated by the divergence of the fits 450, 451 at short timescales).

Other Considerations

Figure 6:
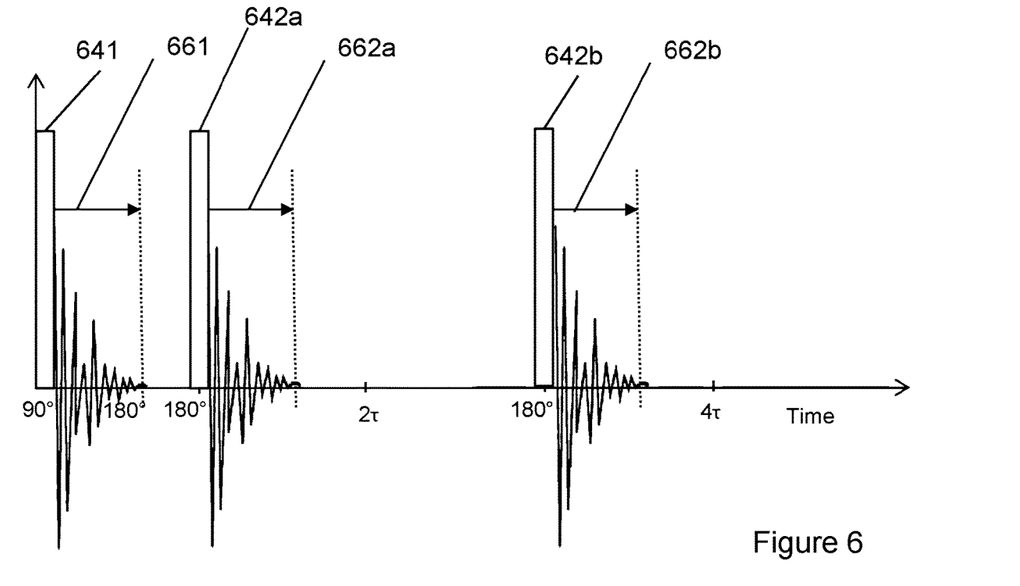
FIG. 6 is a graph showing the dead time of the instrument.

In order to make this combined FID-CPMG method work better, one or more of the following conditions should be satisfied (e.g. by appropriately configuring the apparatus):

a. Homogeneity quality of the magnetic field for sample volume should be good enough to make the echo width wider than $T_E$. This may be achieved by using a better magnet or by decreasing sample size or by decreasing $T_E$.

b. The pulse signal die-off time (or ringing disappearance time) at which the oscillations in the coil following the 90° pulse die out to the noise level should be small (e.g. less than the dead time of the instrument and/or less than 30 μs). It is very challenging to make this die-off time less than 30 μs for traditional strategies especially for low field (several megahertz frequency) NMR instrument. FIG. 6 shows the an instrument with a die-off time 661, 662a,b. In some embodiments the instrument dead time would be matched to be at least as long as the die-off time. The die off time may be considered to be the time for transmitted strong signals (90° and 180° pulses) to die off until it reaches the instrument noise level. This signal was not shown in FIGS. 1-5. Alternatively or in addition, the die-off signal may be cancelled or compensated (e.g. by being determined or predicted beforehand and subtracted from the experimental signal as described below).

c. For normal low field NMR instrument, there is always a low pass filter (e.g. a filter that passes signals with a frequency lower than a certain cutoff frequency and attenuates signals with frequencies higher than the cutoff frequency.) after demodulation of the NMR echoes. The pass band width of the low pass filter should be wide enough to let fast relaxing signal pass through the filter without obvious attenuation. For example, in order to detect any components with $T_2$ around 30 μs or even smaller the low pass filter pass band width has to be at least wider than 1/30 μs (33 kHz) or even wider.

There are various different strategies to decrease the die-off time period, there are lots of factors to make it very hard or not practical or too complicated to decrease this die-off time below 50 μs or even smaller at several megahertz frequency for 2 inch or even bigger probe diameter.

Disclosed embodiments may be configured to ensure that this die-off time is below 0.1 ms or even 0.2 ms (no saturation for die-off signal), which is readily implementable for several megahertz frequency with several inches diameter probe.

As noted above, the dead time is one of the programmable parameters of the instrument, which defines the time period between end of the transmitting pulse and start of the acquiring the NMR signal. FIG. 6 shows a NMR response where the dead time of the instrument is matched to the die-off time 661, 662a-b. During dead time period (where the response is not being acquired), the ringing signal or die-off signal is decreasing and at the moment of ending of the dead time period the ringing or die-off signal is much smaller than NMR signal.

If the acquisition system of the instrument were to collect all points shown in FIG. 6 (or some points during the die-off time), then the points corresponding to die-off time would generally have to be ignored or removed in order to improve the SNR performance, otherwise the ringing or die-off signal will interpret as strong noise for NMR signal.

For a conventional prior art system, the dead time has to be long enough until the ringing or die-off signal is much smaller than NMR signal, at least ten times smaller and preferably twenty times smaller than NMR signal. In other words, the ringing or die-off signal has to be one tenth or one twentieth of the NMR signal. Such a ratio between the die-off signal and the NMR signal may work for presently disclosed embodiments.

However, for certain embodiments disclosed herein, the dead time may have to be just long enough until the ringing or die-off signal is smaller than the saturated signal strength of the analogue amplifier. That is, the certain embodiments may be configured to compensate or cancel out the die-off signal (rather than simply ignoring or not recording the die-off signal). To do this, these embodiments must be able to measure the die-off signal, and to be measureable, the die-off signal must not be saturated. General speaking the saturated signal strength of the analogue amplifier is at least ten times stronger than NMR signal strength.

The threshold for dead time (and when signal acquisition can commence) may therefore be different for a conventional prior art system and presently disclosed embodiments. Some embodiments may have a die-off signal threshold (i.e. the threshold for the die-off signal which can be tolerated) at least one hundred times higher than the one for prior art (saturated signal strength is ten times stronger than NMR signal and ringing or die-off signal for prior art has to be at most one tenth of NMR signal). So the dead time of certain embodiments may be much smaller (e.g. ten or more times smaller) than for a conventional system.

The dead time for this invention may be ten times smaller than the dead time for a conventional instrument with hardware having similar performance (Q factor, probe size, frequency etc.). If the ringing or die-off signal is below saturated signal strength, this invention can cancel the ringing or die-off signal by specified averaging techniques (details described below in Example 3).

Figure 7:
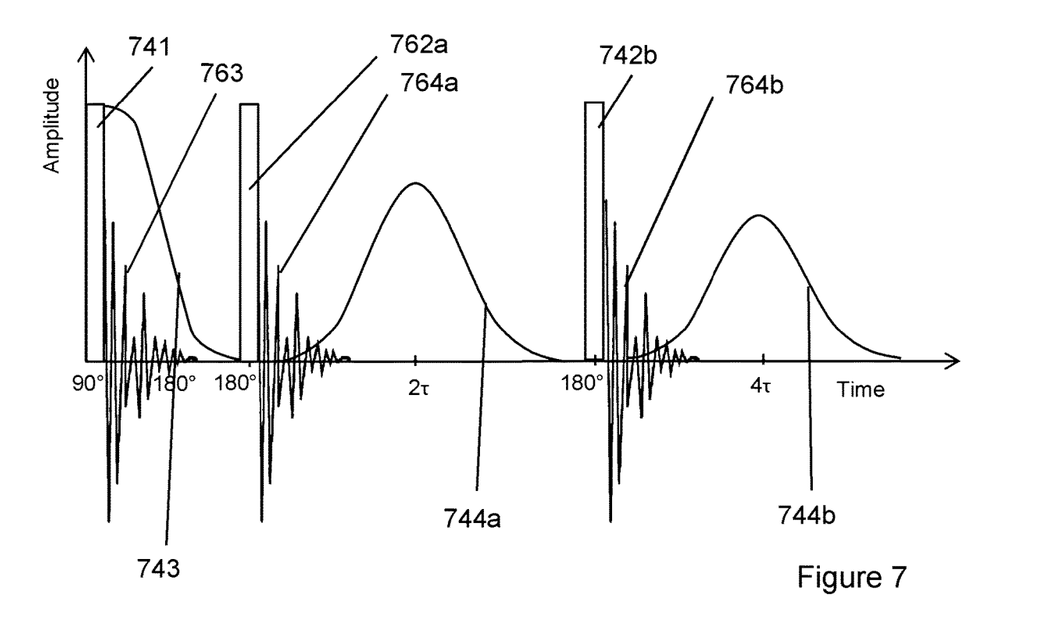
FIG. 7 is a demonstration of signal mixture for useful wanted signal and unwanted noise.

FIG. 7 demonstrates the sequence pulses 741, 762a-b, related die-off signals 763, 764a-b and related FID 743 and CPMG echoes 744a-b. Die-off signals are shown separately from FID and CPMG echoes for convenience, but it will be appreciated that they the die-off signals and the FID and echo signals would be combined in one signal channel.

In the embodiments of FIGS. 3a-3b; and of FIGS. 4-5, the die-off signals were sufficiently short that a significant portion of the response signal can be used between the transverse and refocusing pulses.

Example 3

FIGS. 8-11 show an alternative way of compensating for the die-off time.

Figure 8:
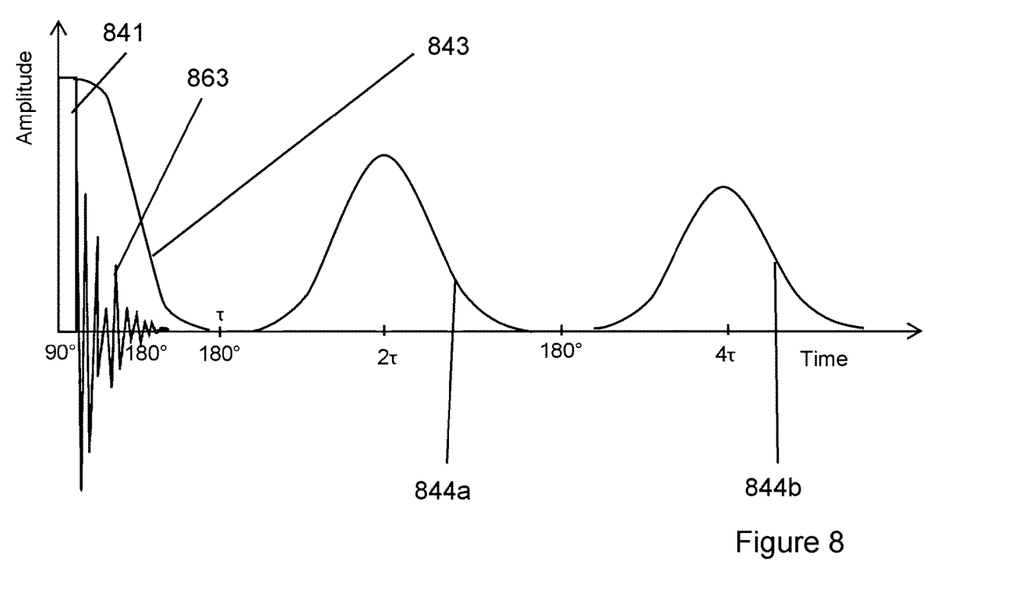
FIG. 8 demonstrates use of CPMG sequence to cancel 180° pulse and its die-off signal.

FIG. 8 demonstrates an embodiment configured to cancel 180° transmitting pulses and its related die-off signals but keep CPMG echoes untouched. This is implemented by inverting 180° pulse for consecutive trains and then combine at least two consecutive trains results together so 180° transmitting pulses and its related die-off signals is canceled to each other but keep CPMG echoes untouched. As it is shown in FIG. 8, 90° transmitting pulses, its related die-off signal and FID signal are not affected. Since 0.1 ms or even 0.2 ms actual instrument dead time the added signal (90° transmitting pulse, 90° pulse die-off signal and FID) becomes too noisy (compared to useful FID signal itself). So for prior-art the traditional CPMG method only CPMG echoes are collected and anything before the first CPMG echo is ignored.

However, simply removing CPMG die-off time may not be enough to detect any components with faster $T_2$ values than $T_E$ of the instrument because any faster relaxing components information is not collected due to too much noise in the FID signal.

As shown in FIG. 8, for each NMR measurement with such a CPMG method, the 90° transmitting pulse and 90° pulse die-off signal are always shown there, and they will be added with FID signal.

However, it may be possible to mitigate or remove the FID signal noise by using a measurement of a control. Since the 90° transmitting pulse and 90° pulse die-off signal are fixed for each measurement of the NMR instrument, the following procedure can be followed to remove or mitigate the 90° transmitting pulse and 90° pulse die-off signal from above added signal:

a. Remove anything from the NMR sensor probe and leave it empty (or use a non-NMR active sample);
 b. Run NMR measurement with traditional CPMG method, but collect everything from start point including 90° pulse die-off signal (and possibly 90° transmitting pulse);
 c. Put the testing sample into the NMR sensor probe;
 d. Run NMR measurement with traditional CPMG method again without any changes of all parameters, and collect everything from start point including the noisy FID signal (90° pulse die-off signal and true FID signal and possibly 90° transmitting pulse);
 e. The collected signal of step d minus the collected signal of step b for each corresponding time point, after this subtraction the subtracted signal is shown in FIG. 9.

Any repeated signal is removed and only useful signal (true FID signal 943 and CPMG echoes 944*a-b*) remains. As noted above, the measured signals should not be saturated to allow accurate subtraction.

Figure 9:
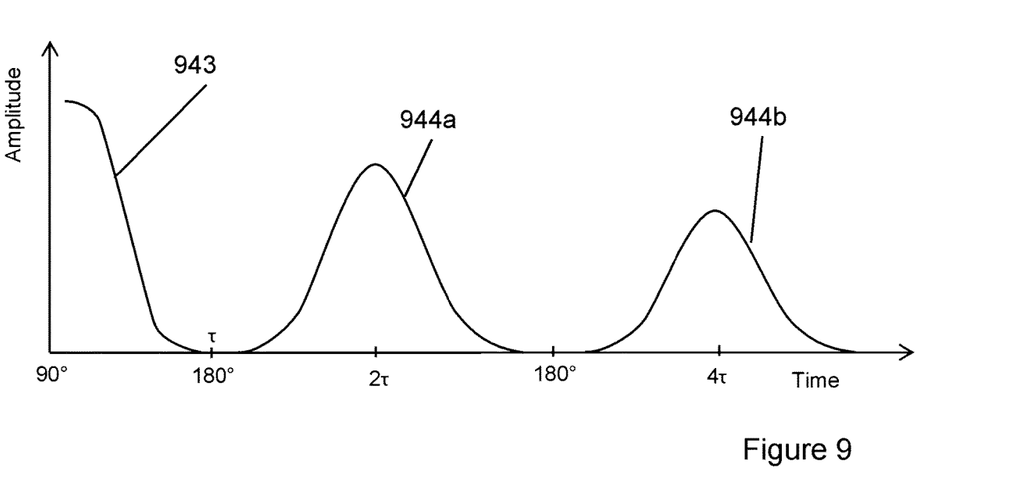
FIG. 9 demonstrates cancelling 90° pulse and its die-off signal.
Figure 10:
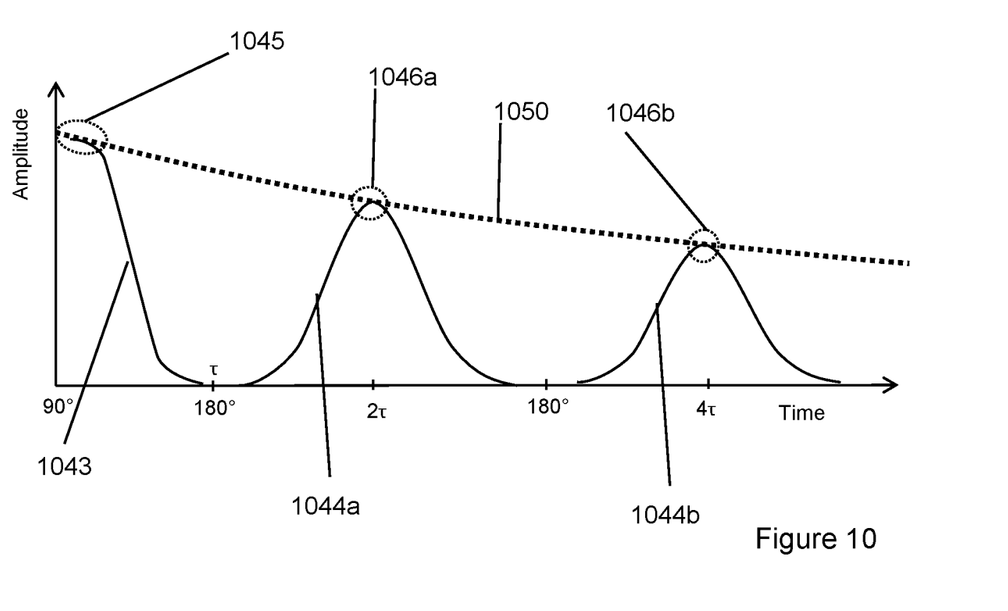
FIG. 10 demonstrates selected points for exponential decay curve fitting.

FIG. 9 demonstrates the useful remained signals 943, 944*a-b*, it is clear not all the collected points can be used as input for exponential decay curve fitting due to poor homogeneity quality of the magnetic field for the sample size area. Only selected points can be used as input of curve fitting, FIG. 10 demonstrates the points 1045, 1046*a-b* can be selected for this specific testing result comprising FID 1043 and CPMG echo 1044*a-b* responses.

Figure 11:
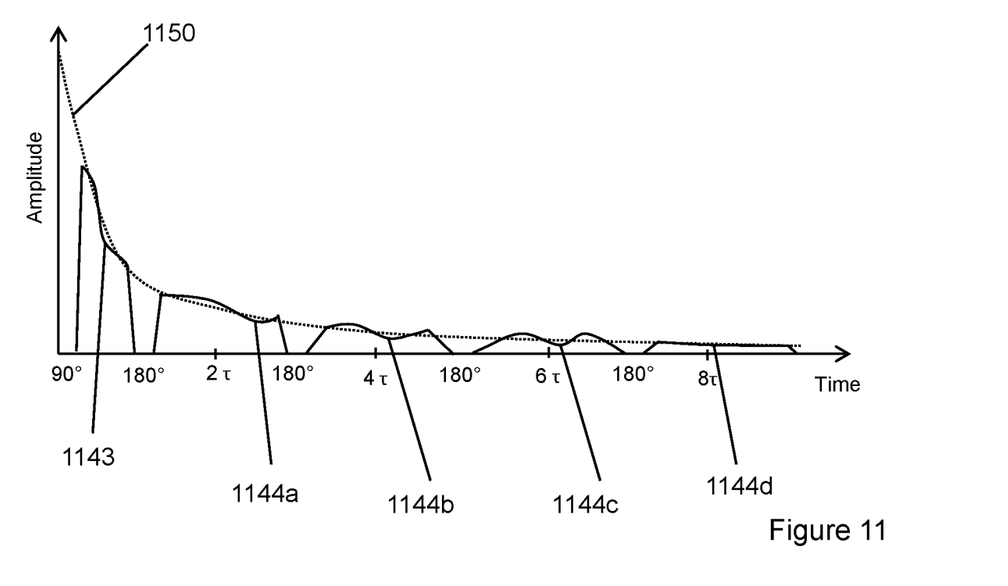
FIG. 11 demonstrates all points for exponential decay curve fitting.

FIG. 11 shows the useful remaining signals for another sample measurement (same as the response shown in FIG. 4). It can be seen from the sample response that the homogeneity quality of magnetic field for the sample size area is better than what is needed (homogeneity quality makes the echo width wider than $T_E$ or 2τ. All the points shown in FIG. 11 can be used as input for exponential decay curve 1150 fitting. The result will be similar to that shown in FIG. 5 (although achieved using a different method for compensating for the die-off time).

As an example, the results for FIG. 11 collected both true FID signal and all CPMG echoes. In this case all relaxing components (no matter if $T_2$ value is faster than $T_E$ or slower than $T_E$) will be able to be detected and measured accurately for one measurement.

Flowchart

Figure 12:
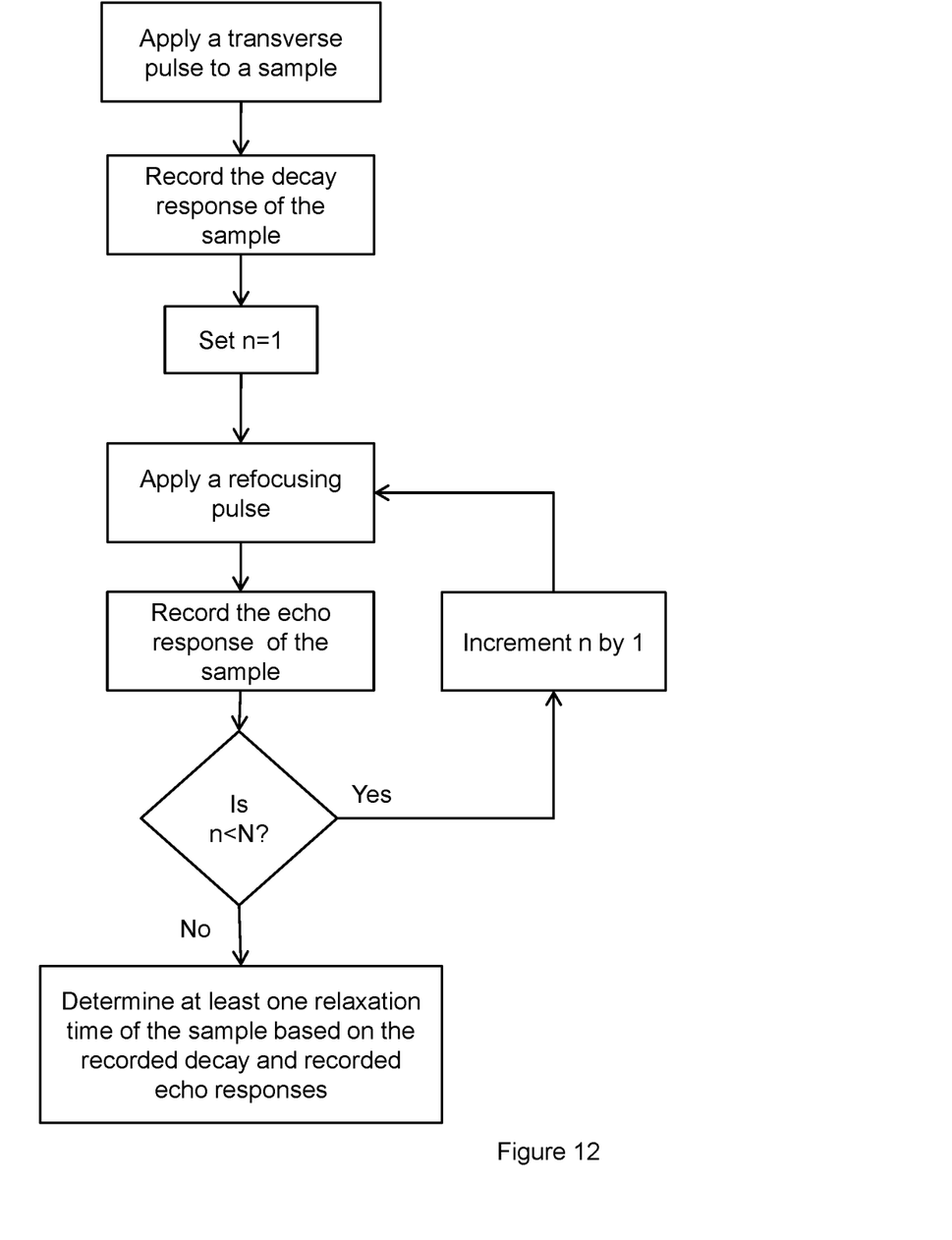
FIG. 12 is a flowchart of an NMR instrument using composite FID-CPMG process.

FIG. 12 gives a flowchart for characterising a sample using NMR with a combination of decay and echo responses. The sequence of pulses applied to the sample comprises one transverse pulse and N refocusing pulses, where N is a positive integer greater or equal to 1. It will be appreciated that an apparatus may be configured to perform the method shown in FIG. 12 by appropriate programming using a computer program (which may be stored in a non-transitory medium such as a CD or hard-disk).

Although the present invention has been described and illustrated with respect to preferred embodiments and preferred uses thereof, it is not to be so limited since modifications and changes can be made therein which are within the full, intended scope of the invention as understood by those skilled in the art.

The invention claimed is:

1. An NMR apparatus, the NMR apparatus comprising a NMR pulse sequence generator; and a NMR response detector, wherein the NMR apparatus comprises an NMR coil, and is configured to:
 apply a single pulse sequence to an initially relaxed sample positioned within the NMR coil, the pulse sequence comprising:
  a single transverse pulse to be applied to a sample;
  a series of one or more refocusing pulses, wherein the first refocusing pulse is configured to be applied a first time period after the transverse pulse and each subsequent refocusing pulse is configured to be applied a respective subsequent time period after the immediately preceding refocusing pulse;
 record a decay response of the sample between the transverse pulse and the first refocusing pulse, and record an echo response at least once after at least one refocusing pulse; and
 enable determination of at least one relaxation time of the sample based on both the recorded decay and echo responses to the single pulse sequence.

2. The apparatus of claim 1, wherein the NMR apparatus is configured to record the decay response multiple times between the transverse pulse and the first refocusing pulse.

3. The apparatus of claim 1, wherein the NMR apparatus is configured to record the decay response for a decay record time between the transverse pulse and the first refocusing pulse, the decay record time being at least 10% of the first time period.

4. The apparatus of claim 1, wherein the NMR apparatus is configured to record the echo response for an echo record time between the successive refocusing pulses, the echo record time being at least 10% of the corresponding subsequent time period.

5. The apparatus of claim 1, wherein the first time period after the transverse pulse is different than the subsequent time periods between successive refocusing pulses.

6. The apparatus of claim 1, wherein the NMR apparatus is configured to record the decay response repeatedly with a time interval of between 1 μs and 10 μs.

7. The apparatus of claim 1, wherein the subsequent time period between successive refocusing pulses is the same for each subsequent refocusing pulse.

8. The apparatus of claim 1, wherein the subsequent time period between successive refocusing pulses is double the duration of the first time period between the transverse pulse and the first refocusing pulse.

9. The apparatus of claim 1, wherein echo time, $T_E$, is greater than 50 μs and less than 100 μs.

10. The apparatus of claim 1, wherein the apparatus is configured to apply the pulse sequence to a sample volume of one or more of: less than 1 ml; between 1 ml and 100 ml; and between 100 ml and 1000 ml.

11. The apparatus of claim 1, wherein the apparatus is configured to subtract a control response from the sample response to compensate for instrument die-off time.

12. The apparatus of claim 1, wherein the apparatus is configured such that each subsequent refocusing pulse is inverted with respect to the immediately preceding pulse.

13. A method of determining the at least one relaxation time of the sample the method comprising:
applying a single pulse sequence to an initially relaxed sample positioned within a NMR coil, the pulse sequence comprising:
a single transverse pulse to a sample;
a series of one or more refocusing pulses to the sample, wherein the first refocusing pulse is applied a first time period after the transverse pulse and each subsequent refocusing pulse is applied a respective subsequent time period after the immediately preceding refocusing pulse,
recording a decay response of the sample between the transverse pulse and the first refocusing pulse, and record an echo response at least once after at least one refocusing pulse; and
enabling determination of at least one relaxation time of the sample based on both the recorded decay and echo responses to the single pulse sequence.

14. The method of claim 13, wherein the at least one relaxation time is less than the echo time, $T_E$.

15. The method of claim 13, wherein the sample comprises hydrocarbons and water.

16. The method of claim 13, wherein the sample comprises an industrial sample.

17. The method of claim 13, wherein the method comprises applying the first refocusing pulse before an experimental response of the transverse pulse applied to the sample has finished decaying.

18. The method of claim 13 wherein the at least one relaxation time has a sample decay time constant ($T_2$) component and an apparatus decay time constant ($T_{2a}$) component, and the sample decay time constant ($T_2$) is less than a predetermined proportion of the apparatus decay time constant ($T_{2a}$).

19. The method of claim 13, wherein the method comprises:
performing an NMR measurement on a control, the control being an NMR inactive sample or no sample;
recording the response of the control, including at times corresponding to a 90° transmitting pulse and a 90° pulse die-off signal;
performing the measurement of the sample with the same NMR parameters as the control; and
recording the response of the sample, including at times corresponding to the 90° transmitting pulse and the 90° pulse die-off signal;
subtracting the recorded response of the control from the recorded response of the sample
enable determination of the at least one relaxation time of the sample based on the result of the subtraction.

20. A non-transitory computer-readable medium comprising a computer program having computer program code configured, when run on a computer, to:
apply a single pulse sequence to an initially relaxed sample positioned within the NMR coil, the pulse sequence comprising:
a single transverse pulse to a sample;
a series of one or more refocusing pulses to the sample, wherein the first refocusing pulse is applied a first time period after the transverse pulse and each subsequent refocusing pulse is applied a respective subsequent time period after the immediately preceding refocusing pulse,
enable recording a decay response of the sample between the transverse pulse and the first refocusing pulse, and record an echo response at least once after at least one refocusing pulse; and
enable determination of at least one relaxation time of the sample based on both the recorded decay and echo responses to the single pulse sequence.

* * * * *